United States Patent
Suzukawa et al.

(10) Patent No.: US 11,553,593 B2
(45) Date of Patent: Jan. 10, 2023

(54) RESIN FILM FOR INTERLAYER INSULATING LAYER WITH SUPPORT, MULTILAYER PRINTED CIRCUIT BOARD, AND METHOD OF MANUFACTURING MULTILAYER PRINTED CIRCUIT BOARD

(71) Applicant: Showa Denko Materials Co., Ltd., Tokyo (JP)

(72) Inventors: Takayuki Suzukawa, Tokyo (JP); Ikuo Sugawara, Tokyo (JP); Tetsurou Irino, Tokyo (JP); Yuuki Tezuka, Tokyo (JP); Masaharu Matsuura, Tokyo (JP)

(73) Assignee: SHOWA DENKO MATERIALS CO., LTD., Tokyo (JP)

( * ) Notice: Subject to any disclaimer, the term of this patent is extended or adjusted under 35 U.S.C. 154(b) by 0 days.

(21) Appl. No.: 17/053,661

(22) PCT Filed: Apr. 25, 2019

(86) PCT No.: PCT/JP2019/017704
§ 371 (c)(1),
(2) Date: Nov. 6, 2020

(87) PCT Pub. No.: WO2019/216247
PCT Pub. Date: Nov. 14, 2019

(65) Prior Publication Data
US 2021/0235582 A1    Jul. 29, 2021

(30) Foreign Application Priority Data
May 9, 2018 (JP) .............................. JP2018-090800

(51) Int. Cl.
| | |
|---|---|
| *H05K 1/11* | (2006.01) |
| *C08G 59/40* | (2006.01) |
| *H05K 1/03* | (2006.01) |
| *H05K 3/46* | (2006.01) |
| *C08G 59/62* | (2006.01) |
| *C08G 59/68* | (2006.01) |

(52) U.S. Cl.
CPC ......... *H05K 1/119* (2013.01); *C08G 59/4007* (2013.01); *C08G 59/621* (2013.01); *C08G 59/688* (2013.01); *H05K 1/0346* (2013.01); *H05K 1/0373* (2013.01); *H05K 1/115* (2013.01); *H05K 3/4632* (2013.01); *H05K 2201/0206* (2013.01); *H05K 2201/0209* (2013.01)

(58) Field of Classification Search
None
See application file for complete search history.

(56) References Cited

U.S. PATENT DOCUMENTS

| | | | |
|---|---|---|---|
| 10,119,047 B2* | 11/2018 | Kotake | ................. B32B 27/38 |
| 10,645,804 B2* | 5/2020 | Matsuura | ............ H05K 1/0306 |
| 2004/0176526 A1* | 9/2004 | Shimo-Ohsako | .... H05K 1/0346 524/514 |
| 2010/0230382 A1* | 9/2010 | Narahashi | .............. H05K 3/381 156/247 |
| 2011/0036625 A1* | 2/2011 | Narahashi | ............ H05K 3/4661 427/97.1 |
| 2011/0120761 A1* | 5/2011 | Kawai | ..................... C08L 63/00 525/472 |
| 2011/0139496 A1* | 6/2011 | Nakamura | ......... C08G 59/4215 525/394 |
| 2011/0244183 A1* | 10/2011 | Goto | .................... C08G 59/686 428/145 |
| 2013/0108861 A1* | 5/2013 | Yokota | ....................... C08J 7/00 428/338 |
| 2015/0210884 A1* | 7/2015 | Hayashi | .............. C08G 59/686 524/611 |
| 2015/0250052 A1* | 9/2015 | Ohkoshi | ............... C09J 163/00 156/247 |
| 2018/0171135 A1* | 6/2018 | Kasahara | ................ C08L 79/00 |
| 2019/0182953 A1* | 6/2019 | Matsuura | ................ B32B 27/20 |
| 2019/0269010 A1* | 8/2019 | Araki | ................... H05K 1/0298 |

FOREIGN PATENT DOCUMENTS

| | | |
|---|---|---|
| JP | 2011-111575 A | 6/2011 |
| JP | 2016-069519 A | 5/2016 |
| JP | 6808945 A | 1/2021 |
| WO | 03/006553 A1 | 1/2003 |
| WO | 2009/035071 A1 | 3/2009 |
| WO | 2016/129655 A1 | 8/2016 |
| WO | 2018/016534 A1 | 1/2018 |

* cited by examiner

Primary Examiner — Megan McCulley
(74) Attorney, Agent, or Firm — Fitch, Even, Tabin & Flannery, LLP

(57) ABSTRACT

The present invention relates to a support-attached resin film for an interlayer insulating layer, including a support, and a resin composition layer formed on one side surface of the support in which the support has particles exposed on the one side surface, and an average maximum height of exposed portions of the particles is 1.0 μm or less, or the support has no particles exposed on the one side surface, a multilayer printed wiring board using the support-attached resin film for an interlayer insulating layer, and the multilayer printed-wiring board.

20 Claims, 1 Drawing Sheet

[Fig. 1]
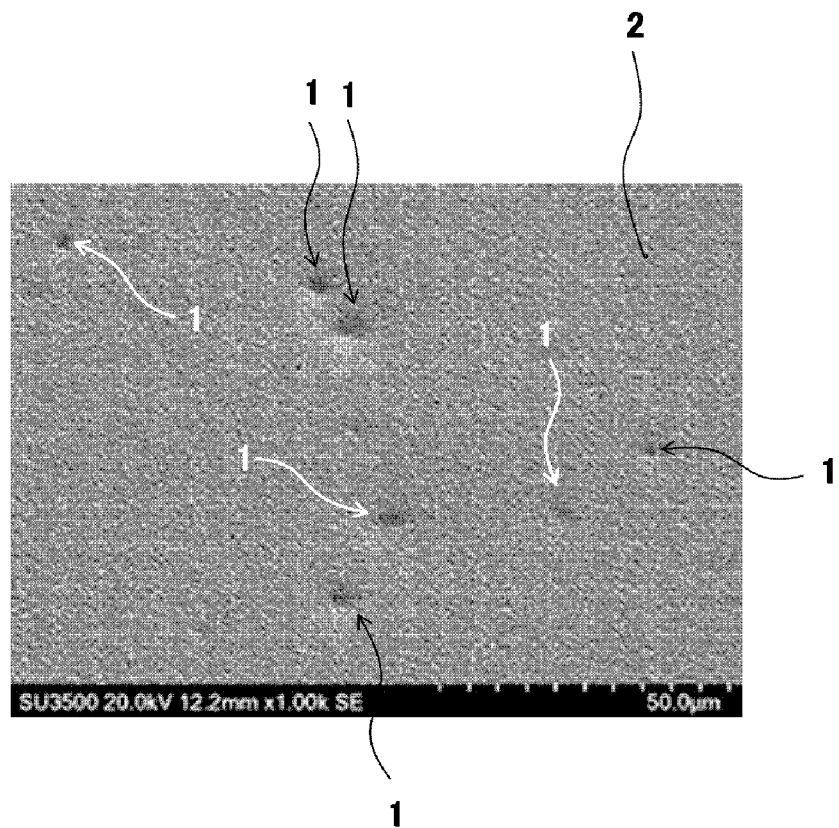
[Fig. 2]
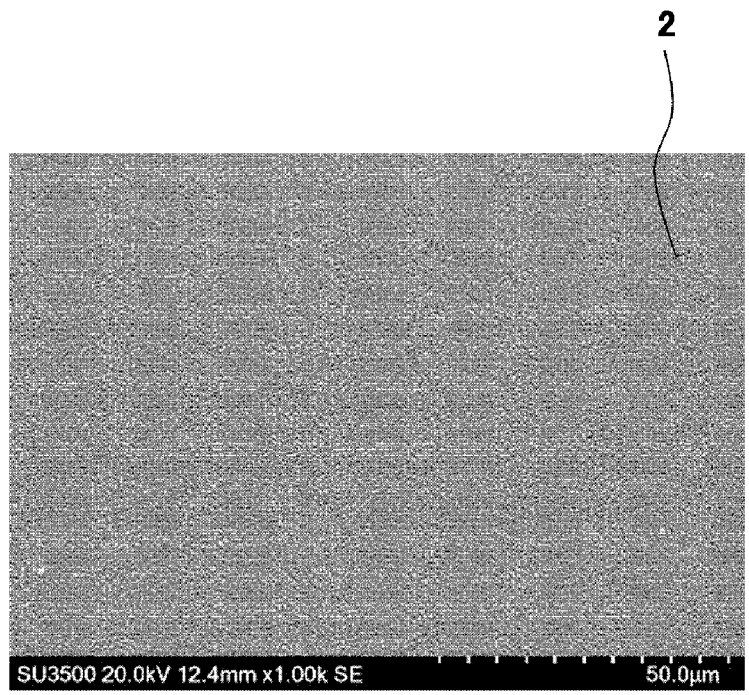

RESIN FILM FOR INTERLAYER INSULATING LAYER WITH SUPPORT, MULTILAYER PRINTED CIRCUIT BOARD, AND METHOD OF MANUFACTURING MULTILAYER PRINTED CIRCUIT BOARD

CROSS-REFERENCE TO RELATED APPLICATIONS

This application is a U.S. national phase application filed under 35 U.S.C. § 371 of International Application No. PCT/JP2019/017704, filed Apr. 25, 2019, designating the United States, which claims priority from Japanese Application No. 2018-090800, filed May 9, 2018, which are hereby incorporated herein by reference in their entirety.

TECHNICAL FIELD

The present invention relates to a support-attached resin film for an interlayer insulating layer, a multilayer printed wiring board, and a method of manufacturing the multilayer printed wiring board.

BACKGROUND ART

In recent years, for a multilayer printed wiring board to be used for electronic devices, communication devices, etc. there is a growing demand for acceleration of an arithmetic processing speed as well as miniaturization, weight reduction, and high density wiring. As a method for manufacturing a multilayer printed wiring board that meets these requirements, for example, a build-up type multilayer printed wiring board is becoming mainstream, in which a prepreg or the like is used as an insulating layer, and only necessary portions are connected through via holes formed by laser irradiation, etc. so that a wiring layer is formed.

In order to realize fine wiring of the multilayer printed wiring board, high smoothness is required for the insulating layer that forms wiring. However, when the above via holes are formed, in some cases, the surface of the insulating layer around the via holes is damaged by laser, and the unevenness of the surface of the insulating layer around the via holes becomes large, which may disrupt fine wiring.

As a method for solving this problem, PTL 1 discloses a construction method in which an adhesive film composed of a support having a release layer, and an organic insulating resin layer is laminated on a core substrate, and is thermally cured with the support attached, and then drilling is performed with laser or a drill while the support is attached or after the support is peeled off. According to this construction method, since the support is attached to the surface of the insulating layer during the drilling processing, a damage to the vicinity of via holes may be suppressed.

CITATION LIST

Patent Literature

PTL 1: WO 2009/035071

SUMMARY OF INVENTION

Technical Problem

However, in the construction method disclosed in PTL 1, since a prepreg containing a fiber base material is used as an insulating layer, there is a limitation to improving the smoothness and the thin-film property of the insulating layer. Therefore, the present inventors have studied a method of curing a resin film not containing a fiber base material while a support is attached, performing necessary processings, and then, peeling off the support. This method makes it possible to form an insulating layer having better smoothness and thin-film property than before. However, it has been found that in a plan view, a dent (hereinafter, also referred to as a "coarse recess") having a diameter of, for example, about 2 µm or more occurs on the surface of the formed insulating layer. FIG. 1 illustrates a surface SEM photograph of an interlayer insulating layer in which coarse recesses are occurring. In FIG. 1, it is confirmed that multiple coarse recesses 1 are present on a surface 2 of the interlayer insulating layer. These recesses lead to a problem such as reduction of a yield rate when fine wiring is formed on the resin surface, and thus, improvement is required.

The present invention has been made to solve such a problem, and an object thereof is to provide a support-attached resin film for an interlayer insulating layer, in which even when curing is performed while the support is attached, the occurrence of coarse recesses is suppressed on the surface of the formed interlayer insulating layer, a multilayer printed wiring board using the support-attached resin film for the interlayer insulating layer, and a method of manufacturing the multilayer printed wiring board.

Solution to Problem

The present inventors have conducted studies to solve the above-described problems, and as a result, have found that the corresponding problems may be solved by the following present invention. That is, the present invention provides the followings [1] to [15].

[1] A support-attached resin film for an interlayer insulating layer, including: the support, and a resin composition layer formed on one side surface of the support, wherein the support has particles exposed on the one side surface, and an average maximum height of exposed portions of the particles is 1.0 µm or less, or the support has no particles exposed on the one side surface.

[2] The support-attached resin film for an interlayer insulating layer described in the above [1], wherein the support is a polyethylene terephthalate film, and a thickness thereof is 75 µm or less.

[3] The support-attached resin film for an interlayer insulating layer described in the above [1] or [2], wherein the resin composition layer is a layer containing a resin composition (1) containing an epoxy resin (a) and a cyanate resin (b).

[4] The support-attached resin film for an interlayer insulating layer described in the above [3], wherein the resin composition (1) further contains one or more types selected from the group consisting of an active ester curing agent (c), a curing accelerator (d), and inorganic filler (e).

[5] The support-attached resin film for an interlayer insulating layer described in the above (4), wherein the resin composition (1) contains the epoxy resin (a), the cyanate resin (b), the active ester curing agent (c), the curing accelerator (d), and the inorganic filler (e), and a content of the epoxy resin (a) is from 5 to 40 parts by mass, a content of the cyanate resin (b) is from 1 to 20 parts by mass, a content of the active ester curing agent (c) is from 2 to 30 parts by mass, a content of the curing accelerator (d) is from 0.01 to 1 parts by mass, and a content of the inorganic filler (e) is from 40 to 85 parts by mass with respect to 100 parts by mass of the resin composition (1) in terms of solid content.

[6] The support-attached resin film for an interlayer insulating layer described in any one of the above [3] to [5], wherein the resin composition (1) further contains one or more types selected from the group consisting of dicyandiamide (f), a phenoxy resin (g) and a resin having a siloxane skeleton (h).

[7] The support-attached resin film for an interlayer insulating layer described in any one of the above [3] to [6], wherein the resin composition layer includes a resin composition layer for the interlayer insulating layer and an adhesive auxiliary layer, and the resin composition layer for the interlayer insulating layer is a layer obtained by forming the resin composition (1) as a layer.

[8] The support-attached resin film for an interlayer insulating layer described in the above [7], wherein the adhesive auxiliary layer is a layer obtained by forming a resin composition (2) containing an epoxy resin (i) and a cyanate resin (j) as a layer.

[9] The support-attached resin film for an interlayer insulating layer described in the above [8], wherein the resin composition (2) further contains one or more types selected from the group consisting of an inorganic filler having a specific surface area of 20 $m^2/g$ or more (k), a polyamide resin containing a polybutadiene skeleton (m), and a phenoxy resin (n).

[10] The support-attached resin film for an interlayer insulating layer described in any one of the above [7] to [9], wherein a thickness of the support is from 10 to 150 μm, a thickness of the resin composition layer for the interlayer insulating layer is from 5 to 50 μm, and a thickness of the adhesive auxiliary layer is 1 to 10 μm.

[11] The support-attached resin film for an interlayer insulating layer described in any one of the above [1] to [10], which is used when the resin composition layer is cured to form the interlayer insulating layer while the support is not peeled off.

[12] A multilayer printed wiring board including an interlayer insulating layer formed by using the support-attached resin film for an interlayer insulating layer described in any one of the above [1] to [11].

[13] The multilayer printed wiring board described in the above [12], wherein an arithmetic mean roughness Ra of the interlayer insulating layer is 300 nm or less.

[14] A method of manufacturing a multilayer printed wiring board, the method including a step of forming an interlayer insulating layer by using the support-attached resin film for an interlayer insulating layer described in any one of the above [1] to [11].

[15] The method of manufacturing the multilayer printed wiring board described in the above [14], wherein the step of forming the interlayer insulating layer is a step of heating the support-attached resin film for an interlayer insulating layer in a state where the support is not peeled off so as to thermally cure the resin composition layer.

Advantageous Effects of Invention

According to the present invention, it is possible to provide a support-attached resin film for an interlayer insulating layer, in which even when curing is performed while the support is attached, the occurrence of coarse recesses is suppressed on the surface of the formed interlayer insulating layer, a multilayer printed wiring board using the support-attached resin film for the interlayer insulating layer, and a method of manufacturing the multilayer printed wiring board.

BRIEF DESCRIPTION OF DRAWINGS

FIG. 1 is a surface SEM photograph of an interlayer insulating layer having coarse recesses; and FIG. 2 is a surface SEM photograph of an interlayer insulating layer formed by using a support-attached resin film for an interlayer insulating layer of the present embodiment.

DESCRIPTION OF EMBODIMENTS

Hereinafter, an embodiment of the present invention will be described in detail. Further, in this specification, in some cases, a numerical range that is equal to or greater than X and equal to or less than Y (X and Y are real numbers) may be expressed as "X to Y." For example, the description "0.1 to 2" indicates a numerical range that is equal to or greater than 0.1 and equal to or less than 2, and the corresponding numerical range includes 0.1, 0.34, 1.03, 2, and the like.

In this specification, an "interlayer insulating layer" is a layer that is located between two conductor layers, and is for insulating the corresponding conductor layers. Examples of the "interlayer insulating layer" in this specification may include a cured product of a resin film for interlayer insulation, and a cured product of a composite film. Further, in this specification, a "layer" also includes one from which a part is missing, or one on which a via or a pattern is formed.

[Support-Attached Resin Film for Interlayer Insulating Layer]

A support-attached resin film for an interlayer insulating layer of the present embodiment (hereinafter, also simply referred to as "a support-attached resin film") has a support and a resin composition layer formed on one side surface of the support.

<Support>

The support included in the support-attached resin film of the present embodiment includes particles exposed on the surface on which the resin composition layer is formed (hereinafter, also referred to as "exposed particles"). An average maximum height of exposed portions of the exposed particles (hereinafter, also referred to as "an average maximum height of exposed portions") is 1.0 μm or less, or no exposed particles are provided on the surface on which the resin composition layer is formed.

When the support has the above configuration, it is possible to suppress the occurrence of coarse recesses on the surface of the interlayer insulating layer to be formed. It is thought that this is because the occurrence of coarse recesses is caused by the transfer of the shape of the particles exposed on the support surface, to the surface of the interlayer insulating layer when the resin film is cured while the support is attached, and then the occurrence of coarse recesses caused by the above transfer is suppressed when the average maximum height of the above exposed portions is set to 1.0 μm or less or the support having no exposed particles is used.

The average maximum height of the above exposed portions is 1.0 μm or less, preferably 0.8 μm or less, more preferably 0.5 μm or less, further preferably 0.3 μm or less from the viewpoint of suppressing the occurrence of coarse recesses. Also, it is most preferable that the support has no exposed particles on the surface on which the resin composition layer is formed.

The average maximum height of the above exposed portions may be measured by using a non-contact type surface roughness measurement device (for example, Contour GT-X, manufactured by Bruker), and specifically may be measured by the method described in Example.

Further, examples of particles exposed on the surface of the support may include particles used as a lubricant during the production of an organic resin film used as the support. Examples of the corresponding particles may include one or more types selected from the group consisting of silica, calcium carbonate, magnesium carbonate, barium carbonate, calcium sulfate, calcium phosphate, magnesium phosphate, kaolin, aluminum oxide, titanium oxide, and organic particles.

The shape of these particles is not particularly limited, and may be any of spherical, plate-like, fibrous shapes, etc. Also, the average particle size of these particles is, for example, 0.1 to 1 µm.

The support may include or may not include these particles, but when included, they are included in a state where the average maximum height of the exposed portions is 1.0 µm or less.

For the support containing these particles, as a method of adjusting the average maximum height of the exposed portions to 1.0 µm or less, a method of selecting particles having a shape whose average maximum height is 1.0 µm or less, and a method of configuring the support as two or more layers, in which a layer on the surface side on which the resin composition layer is formed is set as a layer where the above particles are not added, may be exemplified.

Further, the surface of the support opposite to the surface on which the resin composition layer is formed may have particles exposed on the corresponding surface, or may not have exposed particles.

The material of the support is not particularly limited, but an organic resin film is preferred.

Examples of a material for the organic resin film may include polyolefins such as polyethylene, and polyvinyl chloride; polyesters such as polyethylene terephthalate (hereinafter, also referred to as "PET"), and polyethylene naphthalate; polycarbonate, polyimide, and the like. Among these, from the viewpoint of a price and a handling property, PET is preferable.

The support may be made of one type of material, or may be one obtained through a combination of two or more types of materials. When two or more types of materials are combined, these may be mixed to form a film shape, or a multilayer film having two or more layers made of different materials may be provided. Also, as for the support, metal foil, release paper, or the like may be used.

The thickness of the support is generally 10 to 150 µm, preferably 15 to 75 µm, more preferably 25 to 50 µm. When the thickness of the support is equal to or greater than the above lower limit value, the easiness of the handling property is obtained. Meanwhile, since the support is generally finally peeled off or removed, from the viewpoint of energy saving, etc. it is preferable that the thickness is set to be equal to or less than the above upper limit value. Therefore, from the viewpoint of the handling property, the energy saving, etc., it is preferable that the support is a polyethylene terephthalate film, and its thickness is 75 µm or less.

The support may be subjected to surface treatment such as matt treatment or corona treatment. Also, on the support, a release layer may be formed by carrying out a release treatment with a silicon resin-based release agent, an alkyd resin-based release agent, a fluororesin-based release agent or the like so as to facilitate peeling of the support, after curing is performed while the support is attached. Meanwhile, when peeling is possible without a release layer, the release layer is not necessarily required. Also, the thickness of the release layer may be properly selected within a range that does not impair the effect of the present invention.

<Resin Composition Layer>

The resin composition layer included in the support-attached resin film of the present embodiment is not particularly limited as long as it contains a resin composition that forms the interlayer insulating layer, but is preferably a layer containing a resin composition (1) that contains an epoxy resin (a) (hereinafter, also referred to as a "component (a)") and a cyanate resin (b) (hereinafter, also referred to as a "component (b)").

(Epoxy Resin (a))

The epoxy resin (a) is not particularly limited, but an epoxy resin having two or more epoxy groups in one molecule may be preferably exemplified.

Examples of the epoxy resin (a) may include a bisphenol A type epoxy resin, a bisphenol F type epoxy resin, a bisphenol S type epoxy resin, a biphenol type epoxy resin, a dicyclopentadiene type epoxy resin, a phenol novolac type epoxy resin, a cresol novolac type epoxy resin, a bisphenol A novolac type epoxy resin, a bisphenol S novolac type epoxy resin, a dicyclopentadiene novolac type epoxy resin, an anthracene novolac type epoxy resin, an aralkyl type epoxy resin, an aralkyl novolac type epoxy resin, a tert-butyl-catechol type epoxy resin, a naphthalene type epoxy resin (including a naphthol novolac type epoxy resin), a fluorene type epoxy resin, a xanthene type epoxy resin, an anthracene type epoxy resin, and the like. Among these, a cresol novolac type epoxy resin is preferable from the viewpoint of excellent reflow heat resistance of the obtained interlayer insulating layer.

As for the epoxy resin (a), one type may be used alone, or two or more types may be used in combination.

The epoxy equivalent of the epoxy resin (a) is preferably 150 to 500 g/eq, more preferably 150 to 400 g/eq, further preferably 200 to 300 g/eq, from the viewpoint of obtaining an interlayer insulating layer having a small surface roughness, and an excellent adhesive strength with a conductor layer formed by a plating method. The epoxy equivalent is a mass of a resin per epoxy group (g/eq), and may be measured according to a method prescribed in JIS K 7236.

The content of the epoxy resin (a) in the resin composition (1) is preferably 5 to 40 parts by mass, more preferably 7 to 30 parts by mass, further preferably 10 to 20 parts by mass with respect to 100 parts by mass of the resin composition (1) in terms of solid content, from the viewpoint of smear removal, dielectric loss tangent, and heat resistance.

Here, in this specification, "in terms of solid content" means that only a non-volatile content excluding volatile components such as an organic solvent is set as a reference. That is, 100 parts by mass in terms of solid content means that this is equivalent to 100 parts by mass of non-volatile content.

(Cyanate Resin (b))

The cyanate resin (b) is not particularly limited, but a cyanate resin having two or more cyanato groups in one molecule may be preferably exemplified.

Examples of the cyanate resin (b) may include bisphenol type cyanate resins such as 2,2-bis(4-cyanatophenyl)propane, bis(4-cyanatophenyl)ethane, bis(3,5-dimethyl-4-cyanatophenyl)methane, and 2,2-bis(4-cyanatophenyl)-1,1,1,3,3,3-hexafluoropropane; dicyclopentadiene type cyanate resins such as a cyanate ester compound of a phenol-added dicyclopentadiene polymer; novolac type cyanate resins such as a phenol novolac type cyanate ester compound, and a cresol novolac type cyanate ester compound; α,α'-bis(4-cyanatophenyl)-m-diisopropylbenzene; prepolymers of these cyanate resins (hereinafter, also referred to as "cyanate prepolymers"), and the like.

As for the cyanate resin (b), one type may be used alone, or two or more types may be used in combination.

Among these, a cyanate resin represented by the following general formula (b-1), a cyanate resin represented by the following general formula (b-2) and prepolymers thereof are preferable, from the viewpoint of easy availability, and excellence of the obtained interlayer insulating layer in the dielectric property and the heat resistance.

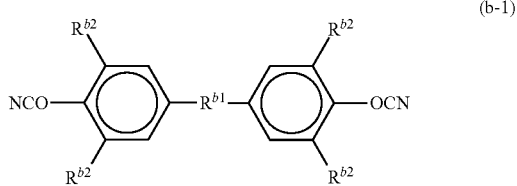
(b-1)

(In the formula, $R^{b1}$ represents an alkylene group having 1 to 3 carbon atoms which may be substituted with a halogen atom, a sulfur atom, or a divalent group represented by the following general formula (b-1-1) or the following general formula (b-1-2). Each $R^{b2}$ independently represents a hydrogen atom or an alkyl group having 1 to 4 carbon atoms)

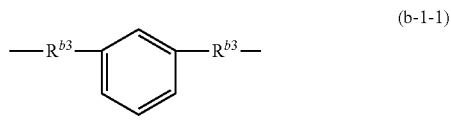
(b-1-1)

(In the formula, each $R^{b3}$ independently represents an alkylene group having 1 to 3 carbon atoms)

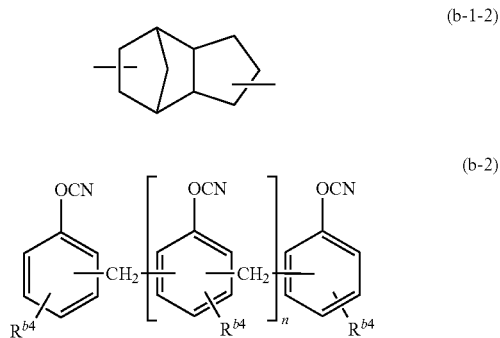
(b-1-2)

(b-2)

(In the formula, each $R^{b4}$ independently represents an alkyl group having 1 to 3 carbon atoms which may be substituted with a hydrogen atom or a halogen atom, and n represents an integer of 1 or more.)

Examples of the alkylene group having 1 to 3 carbon atoms, which is represented by Mb in the above general formula (b-1), a methylene group, an ethylene group, a 1,2-propylene group, a 1,3-propylene group, a 2,2-propylene group ($—C(CH_3)_2—$), and the like. Among these, a methylene group, and a 2,2-propylene group are preferable, and a 2,2-propylene group is more preferable from the viewpoint of obtaining an interlayer insulating layer having a small surface roughness, and an excellent adhesive strength with a conductor layer formed by a plating method. Examples of the halogen atom that replaces the above alkylene group, may include a fluorine atom, a chlorine atom, a bromine atom, an iodine atom, and the like.

Examples of the alkylene group having 1 to 3 carbon atoms, which is represented by $R^{b3}$ in the above general formula (b-1-1), may include a methylene group, an ethylene group, a 1,2-propylene group, a 1,3-propylene group, a 2,2-propylene group ($—C(CH_3)_2—$), and the like. Among these, a methylene group, and a 2,2-propylene group are preferable, and a 2,2-propylene group is more preferable from the viewpoint of obtaining an interlayer insulating layer having a small surface roughness, and an excellent adhesive strength with a conductor layer formed by a plating method.

Examples of the alkyl group having 1 to 4 carbon atoms, which is represented by $R^{b2}$ in the above general formula (b-1), may include a methyl group, an ethyl group, a propyl group, a butyl group, and the like.

Examples of the alkyl group having 1 to 3 carbon atoms, which is represented by $R^{b4}$ in the above general formula (b-2), may include a methyl group, an ethyl group, a propyl group, and the like. Examples of the halogen atom that replaces the above alkyl group, may include a fluorine atom, a chlorine atom, a bromine atom, an iodine atom, and the like.

n is preferably an integer of 1 to 15, more preferably an integer of 1 to 10, and further preferably an integer of 1 to 5 from the viewpoint of the handling property.

The above cyanate prepolymer refers to a polymer in which cyanate resins (b) form a triazine ring by a cyclization reaction, and mainly, a trimer, a pentamer, a heptamer, a nonamer, an undecamer and the like of a cyanate ester compound may be exemplified. In the cyanate prepolymer, the conversion rate of a cyanato group is not particularly limited, but is preferably 30 to 90% by mass, more preferably 35 to 85% by mass, further preferably 40 to 80% by mass from the viewpoint of obtaining good solubility in an organic solvent.

As for the cyanate prepolymer, from the viewpoint of obtaining an interlayer insulating layer having a small surface roughness, and an excellent adhesive strength with a conductor layer formed by a plating method, a prepolymer of a dicyanate compound having two cyanato groups in one molecule is preferable, a prepolymer of the cyanate resin represented by the above general formula (b-1) is more preferable, and a prepolymer in which at least a part of 2,2-bis(4-cyanatophenyl)propane is triazinated to form a trimer (see the following formula (b-3)) is further preferable.

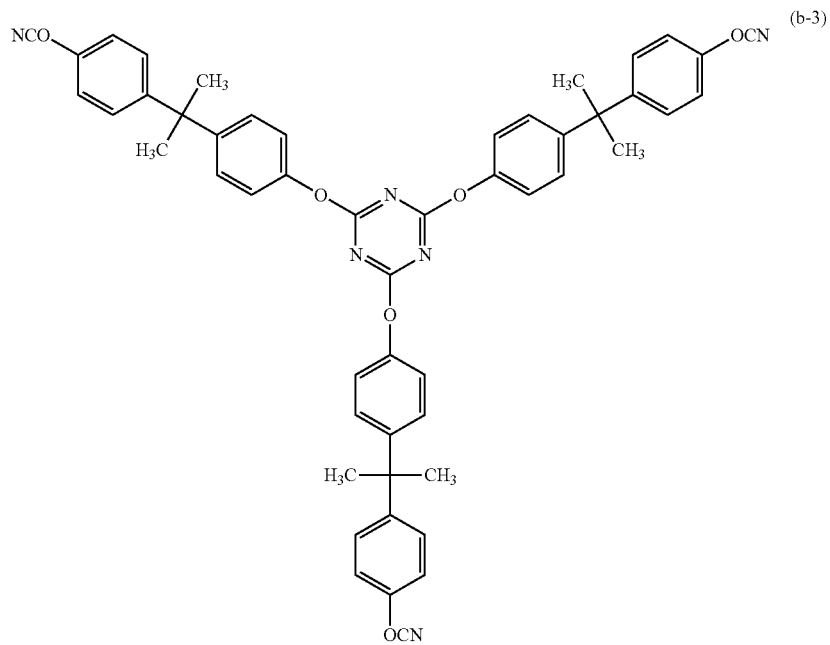
(b-3)

The weight average molecular weight (Mw) of the cyanate prepolymer is not particularly limited, but is preferably 500 to 100,000, more preferably 2,000 to 40,000, further preferably 3,000 to 30,000 from the viewpoint of the solubility in an organic solvent and the workability. When the weight average molecular weight is equal to or greater than the above lower limit value, the crystallization of the cyanate prepolymer is suppressed, and then the solubility in an organic solvent tends to be good. Also, in the case of the above upper limit value or less, an increase of viscosity is suppressed, and then the workability tends to be excellent.

Further, in this specification, the weight average molecular weight (Mw) and the number average molecular weight are measured by using a standard polystyrene calibration curve through gel permeation chromatography (GPC) (manufactured by Tosoh Corporation).

The content of the cyanate resin (b) in the resin composition (1) is preferably 1 to 20 parts by mass, more preferably 2 to 15 parts by mass, further preferably 3 to 10 parts by mass with respect to 100 parts by mass of the resin composition (1) in terms of solid content from the viewpoint of dielectric loss tangent and heat resistance of the obtained interlayer insulating layer.

The mass ratio [(a)/(b)] of the epoxy resin (a) to the cyanate resin (b) in the resin composition (1) is preferably 0.1 to 6, more preferably 1 to 5, further preferably 2 to 4 from the viewpoint of dielectric loss tangent and heat resistance of the obtained interlayer insulating layer.

It is preferable that the resin composition (1) further contains one or more types selected from the group consisting of an active ester curing agent (c) (hereinafter, also referred to as a "component (c)"), a curing accelerator (d) (hereinafter, also referred to as a "component (d)"), and inorganic filler (e) (hereinafter, also referred to as a "component (e)").

(Active Ester Curing Agent (c))

The active ester curing agent (c) is not particularly limited as long as it functions as a curing agent of the epoxy resin (a) and has an active ester.

Examples of the active ester curing agent (c) may include compounds having a highly reactive ester group, and having a curing action of the epoxy resin (a), such as phenol esters, thiophenol esters, N-hydroxyamine esters, ester compounds of heterocyclic hydroxys, and the like.

As for the active ester curing agent (c), one type may be used alone, or two or more types may be used in combination.

As for the active ester curing agent (c), a compound having two or more active ester groups in one molecule is preferable, an aromatic compound obtained from a compound having a polyvalent carboxylic acid and an aromatic compound having a phenolic hydroxy group, which has two or more active ester groups in one molecule, is more preferable, and an aromatic compound obtained from a compound having at least two or more carboxylic acids in one molecule, and an aromatic compound having a phenolic hydroxy group, in which this aromatic compound has two or more ester groups in a molecule of the aromatic compound, is further preferable. Also, the active ester curing agent (c) may contain a linear or multi-branched polymer.

When the above compound having at least two or more carboxylic acids in one molecule is a compound including an aliphatic chain, the compatibility with the epoxy resin (a) and the cyanate resin (b) may be enhanced, and in the case of a compound having an aromatic ring, the heat resistance may be enhanced. In particular, from the viewpoint of heat resistance, etc., it is preferable that the active ester curing agent (c) is obtained by a condensation reaction between one or more types selected from a carboxylic acid compound and a thiocarboxylic acid compound, and one or more types selected from a hydroxy compound and a thiol compound. An active ester compound obtained from a carboxylic acid compound and a phenol compound or a naphthol compound is preferable.

Examples of the carboxylic acid compound may include benzoic acid, acetic acid, succinic acid, maleic acid, itaconic acid, phthalic acid, isophthalic acid, terephthalic acid, pyromellitic acid, and the like. Among these, from the viewpoint of heat resistance, isophthalic acid, and terephthalic acid are preferable.

Examples of the thiocarboxylic acid compound may include thioacetic acid, thiobenzoic acid, and the like.

Examples of the phenol compound or the naphthol compound may include hydroquinone, resorcin, bisphenol A, bisphenol F, bisphenol S, phenolphthaelin, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxy benzophenone, trihydroxy benzophenone, tetrahydroxy benzophenone, fluoroglusin, benzenetriol, dicyclopentadienyldiphenol, phenol novolac, and the like. Among these, from the viewpoint of heat resistance and solubility, dihydroxy benzophenone, trihydroxy benzophenone, tetrahydroxy benzophenone, dicyclopentadienyldiphenol, and phenol novolac are preferable, and dicyclopentadienyldiphenol is more preferable.

Examples of the thiol compound may include benzenedithiol, triazinedithiol, and the like.

The active ester curing agent (c) is not particularly limited, and may be produced by a conventionally known method. Specifically, this may be obtained by a condensation reaction between the above-described carboxylic acid compound and/or the thiocarboxylic acid compound, and the hydroxy compound and/or the thiol compound.

The content of the active ester curing agent (c) in the resin composition (1) is preferably 2 to 30 parts by mass, more preferably 3 to 20 parts by mass, further preferably 4 to 15 parts by mass, with respect to 100 parts by mass of the resin composition (1) in terms of solid content from the viewpoint of the mechanical property, the curing time and the dielectric property of the obtained interlayer insulating layer.

(Curing Accelerator (d))

The curing accelerator (d) is not particularly limited, but an organic phosphorus-based compound is preferable.

Examples of the organic phosphorus-based compound may include ethylphosphine, propylphosphine, butylphosphine, phenylphosphine, trimethylphosphine, triethylphosphine, tributylphosphine, trioctylphosphine, triphenylphosphine, tricyclohexylphosphine, triphenylphosphine/triphenylborane complex, tetraphenylphosphonium tetraphenyl borate, an addition reaction product between a phosphine compound having at least one alkyl group bonded to a phosphorus atom and a quinone compound, and the like.

As for the curing accelerator (d), one type may be used alone, or two or more types may be used in combination.

Among these, an addition reaction product between a phosphine compound having at least one alkyl group bonded to a phosphorus atom and a quinone compound is preferable, and then, an addition reaction product between a phosphine compound having one or more alkyl groups bonded to a phosphorus atom, which is represented by the following general formula (d-1), and a quinone compound represented by the following general formula (d-2) is preferable.

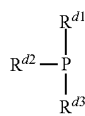
(d-1)

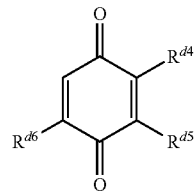
(d-2)

(In the general formula (d-1), $R^{d1}$ represents an alkyl group having 1 to 12 carbon atoms, and each of $R^{d2}$ and $R^{d3}$ independently represents a hydrogen atom or a hydrocarbon group having 1 to 12 carbon atoms. In the general formula (d-2), each of $R^{d4}$ to $R^{d6}$ independently represents a hydrogen atom or a hydrocarbon group having 1 to 18 carbon atoms, and $R^{d4}$ and $R^{d6}$ may be bonded to each other to form a cyclic structure)

Examples of the alkyl group having 1 to 12 carbon atoms, which is represented by $R^{d1}$ in the above general formula (d-1), may include chain alkyl groups such as a methyl group, an ethyl group, a propyl group, an isopropyl group, a n-butyl group, a sec-butyl group, a tert-butyl group, a pentyl group, a hexyl group, an octyl group, a decyl group, and a dodecyl group; cyclic alkyl groups such as a cyclopentyl group, a cyclohexyl group, a cycloheptyl group, a cyclopentenyl group, and a cyclohexenyl group; aryl group-substituted alkyl groups such as a benzyl group; alkoxy group-substituted alkyl groups such as a methoxy group-substituted alkyl group, an ethoxy group-substituted alkyl group, and a butoxy group-substituted alkyl group; amino group-substituted alkyl groups such as a dimethyl amino group, and a diethylamino group; and a hydroxy group-substituted alkyl group.

Examples of the hydrocarbon group having 1 to 12 carbon atoms, which is represented by $R^{d2}$ and $R^{d3}$ in the above general formula (d-1), may include a substituted or unsubstituted aliphatic hydrocarbon group, a substituted or unsubstituted alicyclic hydrocarbon group, a substituted or unsubstituted aromatic hydrocarbon group, and the like.

Examples of the substituted or unsubstituted aliphatic hydrocarbon group may include the same group as the above alkyl group having 1 to 12 carbon atoms, which is represented by $R^{d1}$.

Examples of the substituted or unsubstituted alicyclic hydrocarbon group may include a cyclopentyl group, a cyclohexyl group, a cycloheptyl group, a cyclopentenyl group, a cyclohexenyl group, these substituted with an alkyl group, an alkoxy group, an aryl group, a hydroxy group, an amino group, halogen, and the like.

Examples of the substituted or unsubstituted aromatic hydrocarbon group may include aryl groups such as a phenyl group, and a naphthyl group; alkyl group-substituted aryl groups such as a tolyl group, a dimethylphenyl group, an ethylphenyl group, a butylphenyl group, a t-butylphenyl group, and a dimethylnaphthyl group; alkoxy group-substituted aryl groups such as a methoxyphenyl group, an ethoxyphenyl group, a butoxyphenyl group, a t-butoxyphenyl group, and a methoxynaphthyl group; amino group-substituted aryl groups such as a dimethylamino group, and a diethylamino group; hydroxy-substituted aryl groups such as a hydroxyphenyl group, and a dihydroxyphenyl group; aryloxy groups such as a phenoxy group, and a cresoxy group; a phenylthio group, a tolylthio group, a diphenylamino group, and the like.

Among these, as for the hydrocarbon group having 1 to 12 carbon atoms, which is represented by $R^{d2}$ and $R^{d3}$, a substituted or unsubstituted alkyl group is preferable.

Examples of the phosphine compound represented by the above general formula (d-1) may include trialkylphosphine such as tricyclo hexylphosphine, tributylphosphine, and trioctylphosphine; alkyldiphenylphosphine such as cyclohexyldiphenylphosphine, butyldiphenylphosphine, and octyldiphenylphosphine; dialkylphenylphosphine such as dicyclohexylphenylphosphine, dibutylphenylphosphine, and dioctylphenylphosphine, and the like. Among these, from the viewpoint of varnish solubility, tributylphosphine is preferable.

Examples of the hydrocarbon group having 1 to 18 carbon atoms, which is represented by $R^{d4}$ to $R^{d6}$ in the above general formula (d-2), may include a substituted or unsubstituted aliphatic hydrocarbon group, a substituted or unsubstituted alicyclic hydrocarbon group, a substituted or unsubstituted aromatic hydrocarbon group, and the like. These may be exemplified with the same as the above substituted or unsubstituted aliphatic hydrocarbon group, the substituted or unsubstituted alicyclic hydrocarbon group, and the substituted or unsubstituted aromatic hydrocarbon group, which are represented by $R^{d2}$ and $R^{d3}$.

Examples of the quinone compound represented by the above general formula (d-2) may include 1,4-benzoquinone; alkyl group-substituted 1,4-benzoquinone such as 2,3-dimethyl-1,4-benzoquinone, 2,5-dimethyl-1,4-benzoquinone, and methyl-1,4-benzoquinone; alkoxy group-substituted 1,4-benzoquinone such as 2,3-dimethoxy-1,4-benzoquinone, 2,5-dimethoxy-1,4-benzoquinone, and methoxy-1,4-benzoquinone, and the like. Among these, from the viewpoint of reactivity with a phosphine compound, 1,4-benzoquinone is preferable.

As for the addition reaction product between the phosphine compound having at least one alkyl group bonded to a phosphorus atom, and the quinone compound, a compound represented by the following general formula (d-3) is preferable.

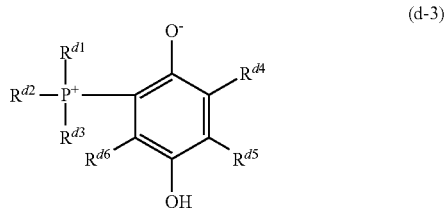

(d-3)

(In the formula, $R^{d1}$ to $R^{d6}$ are the same as $R^{d1}$ to $R^{d6}$ in the above general formulae (d-1) and (d-2))

Among the compounds represented by the above general formula (d-3), an addition reaction product between tributylphosphine and 1,4-benzoquinone is preferable from the viewpoint of reactivity between a phosphine compound and a quinone compound.

The addition reaction product between the phosphine compound having at least one alkyl group bonded to a phosphorus atom, and the quinone compound may be obtained by, for example, a method of subjecting the phosphine compound and the quinone compound used as raw materials to an addition reaction in an organic solvent in which both are dissolved, and then, performing isolation.

The content of the curing accelerator (d) in the resin composition (1) is preferably 0.01 to 1 part by mass, more preferably 0.03 to 0.5 parts by mass, further preferably 0.05 to 0.2 parts by mass with respect to 100 parts by mass of the resin composition (1) in terms of solid content. When the content of the component (d) is equal to or greater than the above lower limit value, a sufficient curing speed may be obtained, and then the flatness of the resin layer on an inner layer pattern, and the appearance of the interlayer insulating layer obtained through curing with attachment of the support are excellent. Also, when the content of the component (d) is equal to or less than the above upper limit value, the handling and the filling property of the obtained resin film are excellent.

(Inorganic Filler (e))

Examples of the inorganic filler (e) may include silica, alumina, barium sulfate, talc, clay, mica powder, aluminum hydroxide, magnesium hydroxide, calcium carbonate, magnesium carbonate, magnesium oxide, boron nitride, aluminum borate, barium titanate, strontium titanate, calcium titanate, bismuth titanate, titanium oxide, barium zirconate, calcium zirconate, and the like. Among these, silica is preferable because of a low cost. As for the inorganic filler (e), one type may be used alone, or two or more types may be used in combination.

The shape of the inorganic filler (e) is not particularly limited, but is preferably spherical from the viewpoint of fluidity (pattern filling property) of the resin composition (1).

The volume average particle size of the inorganic filler (e) is not particularly limited, but is preferably 0.05 to 3 μm, more preferably 0.2 to 2 μm, further preferably 0.3 to 1 μm, particularly preferably 0.4 to 0.8 μm from the viewpoint of a good filling property of a circuit board and an interlayer insulation reliability. Further, the volume average particle size of the inorganic filler (e) may be one type, and different volume average particle sizes may be mixed and used.

The volume average particle size refers to a particle size at a point corresponding to a volume 50% when a cumulative frequency distribution curve based on particle sizes is obtained by setting volumes of particles in total to 100%, and may be measured by a particle size distribution measuring device or the like using a laser diffraction scattering method.

As for the inorganic filler (e), inorganic filler subjected to surface treatment with a surface treatment agent such as a silane coupling agent may be used from the viewpoint of improving moisture resistance.

Examples of the silane coupling agent, an aminosilane coupling agent, a vinylsilane coupling agent, an epoxysilane coupling agent, and the like. Among these, from the viewpoint of storage stability, it is preferable to use spherical silica subjected to surface treatment with a vinylsilane coupling agent. As for this silica subjected to surface treatment, a single product may be used, or silica treated with different silane coupling agents may be used in combination.

The content of the inorganic filler (e) in the resin composition (1) is preferably 40 to 85 parts by mass, more preferably 50 to 80 parts by mass, further preferably 60 to 75 parts by mass with respect to 100 parts by mass of the resin composition (1) in terms of solid content, from the viewpoint of a low thermal expansion property, a high frequency characteristic, and a filling property in a wiring pattern. When the content of the inorganic filler (e) is equal to or greater than the above lower limit value, a low thermal expansion property and a high frequency characteristic to be obtained tend to be good. In the case of the above upper limit value or less, a wiring-pattern filling property to be obtained tends to be good.

It is preferable that the resin composition (1) contains one or more types selected from the group consisting of dicyandiamide (f) (hereinafter, also referred to as a "component (f)"), a phenoxy resin (g) (hereinafter, also referred to as a "component (g)") and a resin having a siloxane skeleton (h) (hereinafter, also referred to as a "siloxane resin (h)" or a "component (h)").

(Dicyandiamide (f))

The dicyandiamide (f) functions as a curing agent of the epoxy resin, and when the component (f) is contained, the adhesive strength between an inner layer circuit pattern and the interlayer insulating layer tends to be excellent.

When the resin composition (1) contains the dicyandiamide (0, the content of the dicyandiamide (f) is preferably 0.005 to 1 part by mass, more preferably 0.01 to 0.5 parts by mass, further preferably 0.02 to 0.1 parts by mass with respect to 100 parts by mass of the resin composition (1) in terms of solid content. When the content of the component (f) is equal to or greater than the above lower limit value, the adhesive strength between the inner layer circuit pattern and the interlayer insulating layer tends to be excellent, and in the case of the above upper limit value or less, precipitation of the component (f) may be suppressed.

(Phenoxy Resin (g))

When the resin composition (1) contains the phenoxy resin (g), the adhesive strength between the obtained interlayer insulating layer and the conductor layer tends to be improved, and the roughened shape of the surface of the interlayer insulating layer tends to be small and dense. Also, when the conductor layer is formed on the interlayer insulating layer by using an electroless plating method, the occurrence of a plating blister is suppressed and the adhesive strength between the interlayer insulating layer and a solder resist tends to be improved.

As for the phenoxy resin (g), one type may be used alone, or two or more types may be used in combination.

Here, the "phenoxy resin" is a general term for polymers in which a main chain is a polyaddition structure between aromatic diol and aromatic diglycidyl ether, and refers to those having a weight average molecular weight of 10,000 or more in this specification. Further, when a polymer in which a main chain is a polyaddition structure between aromatic diol and aromatic diglycidyl ether has an epoxy group, those having a weight average molecular weight of 10,000 or more are classified as phenoxy resins, and those having a weight average molecular weight of less than 10,000 are classified as epoxy resins (a).

The weight average molecular weight of the phenoxy resin (g) is preferably 10,000 to 100,000 from the viewpoint of improving the solubility in an organic solvent, and the mechanical strength and chemical resistance of the interlayer insulating layer. When the weight average molecular weight of the phenoxy resin (g) falls within the above range, the occurrence of a blister in the conductor layer tends to be suppressed.

Examples of the phenoxy resin (g) may include those having one or more types skeletons selected from a bisphenol A skeleton, a bisphenol F skeleton, a bisphenol S skeleton, a bisphenol AF skeleton, a bisphenol trimethyl cyclohexane skeleton, a bisphenol acetophenone skeleton, a novolac skeleton, a biphenyl skeleton, a fluorene skeleton, a dicyclopentadiene skeleton, a norbornene skeleton, a naphthalene skeleton, an anthracene skeleton, an adamantane skeleton, a terpene skeleton, a trimethylcyclohexane skeleton, and a copolymer skeleton of styrene and glycidyl methacrylate. Among these, from the viewpoint of improving the chemical resistance of the interlayer insulating layer, and from the viewpoint of facilitating appropriate unevenness impartment to the interlayer insulating layer by an oxidant in roughening and desmear treatments, etc. a phenoxy resin having a bisphenol A skeleton is preferable. The terminal of the phenoxy resin (g) may be any of functional groups such as a phenolic hydroxy group, and an epoxy group.

When the resin composition (1) contains the phenoxy resin (g), the content of the phenoxy resin (g) is preferably 0.2 to 10 parts by mass, more preferably 0.5 to 5 parts by mass, further preferably 1 to 3 parts by mass with respect to 100 parts by mass of the resin composition (1) in terms of solid content. When the content of the component (g) is equal to or greater than the above lower limit value, sufficient flexibility is obtained, and then the handling property becomes excellent and the peel strength of the conductor layer formed by plating tends to be excellent. In the case of the above upper limit value or less, sufficient fluidity is obtained at the time of laminating, and then obtained roughness tends to be appropriate.

(Resin Having Siloxane Skeleton (h))

The siloxane resin (h) is not particularly limited, but is preferably a resin having a polysiloxane skeleton. In the case where the resin composition (1) contains the siloxane resin (h), when the resin composition (1) is formed into varnish to produce the resin film, even application becomes easy due to no occurrence of cissing, waviness, etc. on an adhesive auxiliary layer.

Examples of the siloxane resin (h) may include polyether-modified polydimethylsiloxane, polyester-modified polydimethylsiloxane, polyester-modified methylalkylpolysiloxane, polyether-modified polymethylalkylsiloxane, aralkyl-modified polymethylalkylsiloxane, polyether-modified polymethylalkylsiloxane, and the like.

As for the siloxane resin (h), one type may be used alone, or two or more types may be used in combination.

When the resin composition (1) contains the siloxane resin (h), the content of the siloxane resin (h) is preferably 0.005 to 1 part by mass, more preferably 0.01 to 0.5 parts by mass, further preferably 0.02 to 0.1 parts by mass with respect to 100 parts by mass of the resin composition (1) in terms of solid content. When the content of the component (h) is equal to or greater than the above lower limit value, the occurrence of waviness, etc. is suppressed during coating and then even application becomes easy. In the case of the above upper limit value or less, after desmear, the roughened shape becomes homogeneous, and the heat resistance also becomes good.

(Other Components)

The resin composition (1) may contain or may not contain components other than the above components in a range where the effect of the present invention is not inhibited. Examples of other components may include resin components such as a bismaleimide compound, a bismaleimide compound and a diamine compound, a bisallyl nadide resin, and a benzoxazine compound; thickeners such as orben, and benton; adhesion imparting agents such as imidazole-based, thiazole-based, triazole-based, and silane coupling agents; rubber particles; coloring agents such as carbon black; and flame retardants such as aluminum hydroxide, and magnesium hydroxide.

The composition of the resin composition (1) is not limited to the above-described configuration, and may be properly adjusted according to the purposes thereof. However, it is desirable that the epoxy resin (a), the cyanate resin (b), the active ester curing agent (c), the curing accelerator (d) and the inorganic filler (e) are contained, and then the content of the epoxy resin (a) is 5 to 40 parts by mass, the content of the cyanate resin (b) is 1 to 20 parts by mass, the content of the active ester curing agent (c) is 2 to 30 parts by mass, the content of the curing accelerator (d) is 0.01 to 1 part by mass, and the content of the inorganic filler (e) is 40 to 85 parts by mass, with respect to 100 parts by mass of the resin composition (1) in terms of solid content.

(Organic Solvent) The resin composition (1) may contain an organic solvent and then may be placed in a varnish state from the viewpoint of facilitating handling and the viewpoint of facilitating formation of the resin film.

The organic solvent is not particularly limited, but examples thereof may include ketone-based solvents such as acetone, methyl ethyl ketone (hereinafter, also referred to as "MEK"), methylisobutylketone, and cyclohexanone; acetic acid ester-based solvents such as ethyl acetate, butyl acetate, cellosolve acetate, propyleneglycol monomethylether acetate, and carbitol acetate; carbitol-based solvents such as cellosolve, and butylcarbitol; aromatic hydrocarbon-based solvents such as toluene, and xylene; amide-based solvents such as dimethyl formamide, dimethyl acetamide, and N-methyl pyrrolidone. Among these, from the viewpoint of solubility, a ketone-based solvent is preferable, and MEK, and methyl isobutyl ketone are more preferable.

As for the organic solvent, one type may be used alone, or two or more types may be used in combination.

The resin composition layer included in the support-attached resin film of the present embodiment may be composed of only the above resin composition (1), but it is desirable that a resin composition layer for the interlayer insulating layer and an adhesive auxiliary layer are included, and the resin composition layer for the interlayer insulating layer is a layer obtained when the resin composition (1) is formed as a layer.

When the resin composition layer includes the resin composition layer for the interlayer insulating layer and the adhesive auxiliary layer, the support-attached resin film of the present embodiment may allow a conductor layer to be formed with a high adhesive strength on a smoother interlayer insulating layer.

Further, no clear interface may be present between the adhesive auxiliary layer and the resin composition layer for the interlayer insulating layer, and for example, a state may be made in which a part of constituent components of the adhesive auxiliary layer is flowed into the resin composition layer for the interlayer insulating layer.

Hereinafter, in the case where the resin composition layer included in the support-attached resin film of the present embodiment includes the resin composition layer for the interlayer insulating layer and the adhesive auxiliary layer, a preferable embodiment will be described.

<Resin Composition Layer for Interlayer Insulating Layer>

The resin composition layer for the interlayer insulating layer is a layer that comes in direct contact with the circuit board during laminating, is melted, and then serves a role of filling the circuit board by flowing into the wiring pattern when the support-attached resin film of the present embodiment is used to produce a printed wiring board. Also, when through holes, via holes etc. are present in the circuit board, this serves a role of filling the inside of the corresponding holes by flowing into them.

The resin composition layer for the interlayer insulating layer is obtained when the resin composition (1) is formed as a layer.

The thickness of the resin composition layer for the interlayer insulating layer may be determined by the thickness of the conductor layer to be formed in the printed wiring board, but is preferably 5 to 50 µm, more preferably 10 to 45 µm, further preferably 20 to 40 µm from the viewpoint of reducing the thickness of the printed wiring board.

<Adhesive Auxiliary Layer>

The adhesive auxiliary layer is a layer that insulates multi-layered circuit patterns from each other in a multilayer printed wiring board, and serves a role of increasing plating peel strength due to smoothness.

The thickness of the adhesive auxiliary layer is preferably 1 to 10 µm, more preferably 2 to 7 µm, further preferably 3 to 5 µm from the viewpoint of obtaining the interlayer insulating layer having a smooth surface, and high adhesion to the conductor layer formed by a plating method.

It is desirable that the adhesive auxiliary layer is a layer obtained when a resin composition (2) containing an epoxy resin (i) (hereinafter, also referred to as a "component (i)") and a cyanate resin (j) (hereinafter, also referred to as a "component (j)") is formed as a layer.

(Epoxy Resin (i))

The epoxy resin (i) is not particularly limited, but examples thereof may include those which are the same as the above epoxy resins (a). Among these, an aralkyl novolac type epoxy resin is preferable, and an aralkyl novolac type epoxy resin having a biphenyl skeleton is more preferable from the viewpoint of excellent reflow heat resistance of the obtained interlayer insulating layer.

The aralkyl novolac type epoxy resin having a biphenyl skeleton refers to an aralkyl novolac type epoxy resin containing an aromatic ring of a biphenyl derivative in a molecule, and examples thereof may include an epoxy resin including a structural unit represented by the following general formula (i-1).

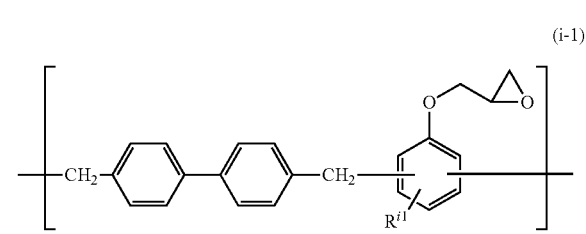

(i-1)

(In the formula, $R^{i1}$ represents a hydrogen atom or a methyl group)

The content of the structural unit represented by the general formula (i-1), in the epoxy resin (i), is preferably 50 to 100% by mass, more preferably 70 to 100% by mass, further preferably 80 to 100% by mass from the viewpoint of obtaining an interlayer insulating layer having a small surface roughness after desmear, and an excellent adhesive strength with a conductor layer formed by a plating method.

As for the epoxy resin including the structural unit represented by the above general formula (i-1), from the same viewpoint, an epoxy resin represented by the following general formula (i-2) is preferable.

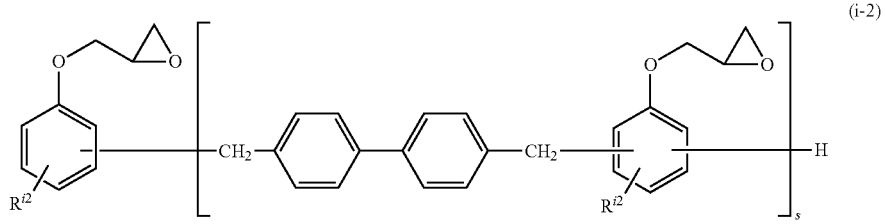

(i-2)

(In the formula, each $R^{i2}$ independently represents a hydrogen atom or a methyl group, and s represents an integer of 1 or more)

s in the above general formula (i-2) is preferably an integer of 1 to 20, more preferably an integer of 1 to 10, and further preferably an integer of 1 to 8 from the viewpoint of reducing the surface roughness after desmear.

The content of the epoxy resin (i) in the resin composition (2) is preferably 10 to 60 parts by mass, more preferably 20 to 50 parts by mass, further preferably 25 to 40 parts by mass, with respect to 100 parts by mass of the resin composition (2) in terms of solid content from the viewpoint of obtaining the interlayer insulating layer having a smooth surface, and high adhesion to the conductor layer.

(Cyanate Resin (j))

The cyanate resin (j) is not particularly limited, but examples thereof may include those which are the same as the above cyanate resins (b).

The content of the cyanate resin (j) in the resin composition (2) is preferably 10 to 60 parts by mass, more preferably 20 to 50 parts by mass, further preferably 25 to 40 parts by mass with respect to 100 parts by mass of the resin composition (2) in terms of solid content from the viewpoint of obtaining the interlayer insulating layer having a smooth surface, and high adhesion to the conductor layer.

It is desirable that the resin composition (2) further contains one or more types selected from the group consisting of inorganic filler having a specific surface area of 20 $m^2/g$ or more (k) (hereinafter, also simply referred to as "inorganic filler (k)" or a "component (k)"), a polybutadiene skeleton-containing polyamide resin (m) (hereinafter, also referred to as a "polyamide resin (m)" or a "component (m)"), and a phenoxy resin (n) (hereinafter, also referred to as a "component (n)").

(Inorganic Filler Having Specific Surface Area of 20 $m^2/g$ or More (k))

The inorganic filler (k) is important from the viewpoint of making it possible to adjust a laser-processed shape by preventing scattering of a resin when the interlayer insulating layer formed by thermally curing the resin composition (2) is laser-processed. Also, when the surface of the interlayer insulating layer is roughened with an oxidant, a properly roughened surface may be formed, which makes it possible to form a conductor layer having an excellent adhesive strength through plating.

Examples of the inorganic filler (k) may include silica, alumina, barium sulfate, talc, clay, mica powder, aluminum hydroxide, magnesium hydroxide, calcium carbonate, magnesium carbonate, magnesium oxide, boron nitride, aluminum borate, barium titanate, strontium titanate, calcium titanate, bismuth titanate, titanium oxide, barium zirconate, calcium zirconate, and the like. Among these, silica is preferable because of a low cost. As for the inorganic filler (k), one type may be used alone, or two or more types may be used in combination.

It is preferable that the inorganic filler (k) has a small particle size from the viewpoint of forming fine wiring.

The specific surface area of the inorganic filler (k) is 20 $m^2/g$ or more, preferably 60 to 200 $m^2/g$, more preferably 90 to 130 $m^2/g$ from the viewpoint of forming an appropriate roughened surface, and forming a conductor layer excellent in the adhesive strength.

The specific surface area may be obtained through a BET method by low temperature/low humidity physical adsorption of inert gas. Specifically, molecules having a conventionally known adsorption occupation area, such as nitrogen, may be adsorbed on the surfaces of powder particles at a liquid nitrogen temperature, and the specific surface area of the powder particles may be obtained from the adsorption amount.

As for the inorganic filler (k), commercially available products may be used. Examples thereof may include fumed silica such as "AEROSIL (registered trademark) R972" (manufactured by Nippon AEROSIL Co., Ltd., a product name, a specific surface area: 110±20 $m^2/g$) and "AEROSIL (registered trademark) R202" (manufactured by Nippon AEROSIL Co., Ltd., a product name, a specific surface area: 100±20 $m^2/g$), and colloidal silica such as "PL-1" (manufactured by FUSO Chemical Co., Ltd., a product name, a specific surface area: 181 $m^2/g$) and "PL-7" (manufactured by FUSO Chemical Co., Ltd., a product name, a specific surface area: 36 $m^2/g$). Among these, from the viewpoint of insulation reliability and heat resistance, those having good dispersibility in the epoxy resin (i) are preferable, and "AEROSIL (registered trademark) R972" (product name, manufactured by Nippon AEROSIL Co., Ltd.), "AEROSIL (registered trademark) R202" (manufactured by the same company), etc. whose surfaces are hydrophobized, are preferable.

The content of the inorganic filler (k) in the resin composition (2) is preferably 1 to 40 parts by mass, more preferably 2 to 30 parts by mass, further preferably 3 to 25 parts by mass with respect to 100 parts by mass of the resin composition (2) in terms of solid content. When the content of the inorganic filler (k) is equal to or greater than the above lower limit value, it is possible to prevent resin scattering during a laser processing, and to adjust the laser processed-shape of the interlayer insulating layer. Also, the surface roughness of the interlayer insulating layer to be formed may become moderately large, and a high plating peel strength may be obtained. Meanwhile, when the content of the inorganic filler (k) is equal to or less than the above upper limit value, a high plating peel strength may be obtained.

(Polybutadiene Skeleton-Containing Polyamide Resin (m))

The component (m) is a polyamide resin containing a polybutadiene skeleton. In the present embodiment, a "polyamide resin" means a polymer having an amide bond (—NHCO—) in a main chain, which may be a polyamide-imide resin having an amide bond and an imide bond, but a polyamide resin having no imide bond is preferable.

As for the polyamide resin (m), a polyamide resin (hereinafter, also referred to as a "modified polyamide resin") including a structural unit represented by the following general formula (m-1), a structural unit represented by the following general formula (m-2), and a structural unit represented by the following general formula (m-3) is preferable.

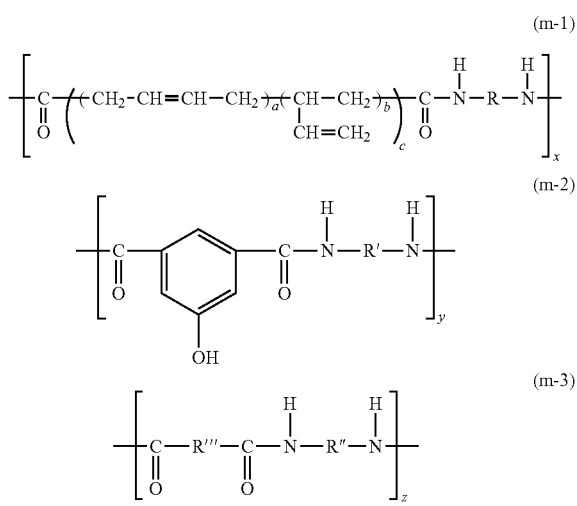

In the general formulae (m-1) to (m-3), each of a, b, c, x, y and z is an average degree of polymerization, a, b, and c represent integers of 2 to 10, 0 to 3, and 3 to 30, respectively, y+z=2 to 300 ((y+z)/x) for x=1, and z>20 (z/y) for y=1.

Each of R, R' and R" is independently a divalent group derived from aromatic diamine or aliphatic diamine, and R'" is a divalent group derived from an aromatic dicarboxylic acid, an aliphatic dicarboxylic acid or an oligomer having carboxy groups at both terminals.

Examples of the aromatic diamine used for producing the above modified polyamide resin may include diaminobenzene, diaminotoluene, diaminophenol, diamino dimethylbenzene, diaminomesitylene, diamino nitrobenzene, diaminodiazobenzene, diaminonaphthalene, diaminobiphenyl, diaminodimethoxybiphenyl, diaminodiphenylether, diaminodimethyldiphenylether, methylenediamine, methylenebis(dimethoxyaniline), methylenebis(methoxyaniline), methylenebis(dimethoxyaniline), methylenebis(ethylaniline), methylenebis(diethylaniline), methylenebis(ethoxyaniline), methylenebis(diethoxyaniline), isopropylidene dianiline, diaminobenzophenone, diaminodimethylbenzophenone, diaminoanthraquinone, diaminodiphenylthioether, diaminodimethyldiphenylthioether, diaminodiphenylsulfone, diaminodiphenylsulfoxide, diaminofluorene, and the like.

Examples of the aliphatic diamine used for producing the above modified polyamide resin may include ethylenediamine, propanediamine, hydroxypropanediamine, butanediamine, heptanediamine, hexanediamine, diaminodiethylamine, diaminopropylamine, cyclopentanediamine, cyclohexanediamine, azapentanediamine, triazaundecadiamine, and the like. These may be used alone or as a mixture of two or more types.

Examples of the dicarboxylic acid containing a phenolic hydroxy group, which is used for producing the above modified polyamide resin, may include hydroxyisophthalic acid, hydroxyphthalic acid, hydroxyterephthalic acid, dihydroxyisophthalic acid, dihydroxyterephthalic acid, and the like.

Examples of the dicarboxylic acid not containing a phenolic hydroxy group, which is used for the above modified polyamide resin, may include aromatic dicarboxylic acid, aliphatic dicarboxylic acid, an oligomer having carboxy groups at both terminals, and the like.

Examples of the aromatic dicarboxylic acid may include phthalic acid, isophthalic acid, terephthalic acid, biphenyldicarboxylic acid, methylenedibenzoic acid, thiodibenzoic acid, carbonyldibenzoic acid, sulfonylbenzoic acid, naphthalene dicarboxylic acid, and the like.

Examples of the aliphatic dicarboxylic acid may include oxalic acid, malonic acid, methylmalonic acid, succinic acid, glutaric acid, adipic acid, maleic acid, fumaric acid, malic acid, tartaric acid, (meth)acryloyloxysuccinic acid, di(meth)acryloyloxysuccinic acid, (meth)acryloyloxymalic acid, (meth)acrylamide succinic acid, (meth)acrylamidemalic acid, and the like. These may be used alone or as a mixture of two or more types.

As for the polyamide resin (m), commercially available products may be used. Examples of the polyamide resin (m) as commercially available products may include polyamide resins "BPAM-01" and "BPAM-155" manufactured by Nippon Kayaku Co., Ltd. (both are product names), and the like. "BPAM-155" is rubber-modified polyamide having an amino group at a terminal, and has a reactivity with an epoxy group. Thus, an interlayer insulating layer obtained from the resin composition (2) containing "BPAM-155" is more excellent in the adhesive strength with a conductor layer formed by a plating method, and tends to have a small surface roughness.

The number average molecular weight of the polyamide resin (m) is preferably 20,000 to 30,000, more preferably 22,000 to 29,000, further preferably 24,000 to 28,000 from the viewpoint of solubility in a solvent and film thickness retention of the adhesive auxiliary layer after lamination.

The weight average molecular weight of the polyamide resin (m) is preferably 100,000 to 140,000, more preferably 103,000 to 130,000, further preferably 105,000 to 120,000 from the same viewpoint.

The content of the polyamide resin (m) in the resin composition (2) is preferably 1 to 15 parts by mass, more preferably 3 to 12 parts by mass, further preferably 5 to 10 parts by mass with respect to 100 parts by mass of the resin composition (2) in terms of solid content. When the content of the polyamide resin (m) is equal to or greater than the above lower limit value, the adhesive strength with a conductor layer formed by a plating method tends to be excellent. In the case of the above upper limit value or less, when the interlayer insulating layer is roughened with an oxidant, the surface roughness of the interlayer insulating layer tends to be suppressed from being increased, and the reflow heat resistance also tends to be excellent.

(Phenoxy Resin (n))

The phenoxy resin (n) is not particularly limited, but examples thereof may include those which are the same as the above phenoxy resins (g).

The content of the phenoxy resin (n) in the resin composition (2) is preferably 1 to 15 parts by mass, more preferably 3 to 12 parts by mass, further preferably 5 to 10 parts by mass with respect to 100 parts by mass of the resin composition (2) in terms of solid content, from the viewpoint of obtaining the interlayer insulating layer having a smooth surface, and high adhesion to the conductor layer formed by a plating method, and from the viewpoint of suppressing occurrence of a plating blister.

(Curing Accelerator (o))

It is preferable that the resin composition (2) contains a curing accelerator (o) (hereinafter, also referred to as a "component (o)").

The curing accelerator (o) is not particularly limited, but examples thereof may include those which are the same as the above curing accelerators (d).

The content of the curing accelerator (o) in the resin composition (2) is preferably 0.01 to 1 part by mass, more preferably 0.03 to 0.5 parts by mass, further preferably 0.05 to 0.2 parts by mass with respect to 100 parts by mass of the resin composition (2) in terms of solid content, from the viewpoint of obtaining the interlayer insulating layer having a smooth surface, and high adhesion to the conductor layer formed by a plating method, and from the viewpoint of suppressing occurrence of a plating blister.

The resin composition (2) may contain other components, an organic solvent, etc. which may be contained in the above resin composition (1), in a range where the effect of the present invention is not inhibited.

<Protective Film>

The support-attached resin film of the present embodiment may include a protective film on the surface of the resin composition layer opposite to the support. The protective film is used for the purpose of preventing adhesion of foreign matter, etc. to the resin film, and scratches, and is usually peeled off before the support-attached resin film of the present embodiment is laminated on the circuit board or the like through lamination, heat-press, etc.

The protective film is not particularly limited, but the same material as that for the support may be used. The thickness of the protective film is, for example, 1 to 40 μm.

<Method of Producing Support-Attached Resin Film>

The support-attached resin film may be produced by applying, for example, a resin composition for forming an interlayer insulating layer on one side surface of a support, and forming a resin composition layer.

The application of the resin composition may be carried out by using, for example, a conventionally known coating apparatus such as a comma coater, a bar coater, a kiss coater, a roll coater, a gravure coater, or a die coater. The coating apparatus may be properly selected according to a target film thickness.

As for a method of producing a support-attached resin film including a resin composition layer for an interlayer insulating layer and an adhesive auxiliary layer, for example, a method may be exemplified in which the resin composition (2) in a varnish state is coated on one side surface of the support, dried by heating, hot air blowing, etc. and formed into the adhesive auxiliary layer, and then, the resin composition (1) in a varnish state is coated on the adhesive auxiliary layer, dried and formed into the resin composition layer for the interlayer insulating layer.

As another method, for example, a method may also be exemplified in which the adhesive auxiliary layer is formed on the support through the above described method, and the resin composition layer for the interlayer insulating layer is separately formed on a peelable film, and then the adhesive auxiliary layer formed on the support and the resin composition layer for the interlayer insulating layer formed on the film are laminated such that the surface on which the adhesive auxiliary layer is formed is in contact with the surface on which the resin composition layer for the interlayer insulating layer is formed. In this case, the peelable film of the resin composition layer for the interlayer insulating layer may also serve a role as a protective film of the resin film.

The condition for drying after the resin composition (1) and the resin composition (2) are coated is not particularly limited, but is a condition under which the content of an organic solvent in the dried resin composition layer is preferably 10% by mass or less, more preferably 5% by mass or less. The drying condition varies according to an amount and a type of an organic solvent in a varnish, but, for example, a varnish containing 30 to 80% by mass of organic solvent is preferably dried for about 3 to 10 min at 50 to 150° C.

The obtained support-attached resin film may be wound in a roll form, and saved and stored.

[Multilayer Printed Wiring Board and Manufacturing Method Thereof]

A multilayer printed wiring board of the present embodiment includes the interlayer insulating layer formed by using the support-attached resin film of the present embodiment.

A method of manufacturing the multilayer printed wiring board of the present embodiment is a method including a step of forming an interlayer insulating layer by using a support-attached resin film for the interlayer insulating layer of the present embodiment. It is more desirable that the step of forming the interlayer insulating layer is a step in which the support-attached resin film for the interlayer insulating layer of the present embodiment is heated in a state where the support is not peeled off, so that the resin composition layer is thermally cured.

Specifically, the manufacturing method including the following steps (1) to (6) may be exemplified.

(1) a step of laminating the support-attached resin film of the present embodiment on one surface or both surfaces of a circuit board (hereinafter, referred to as a laminating step (1)).

(2) a step of forming the interlayer insulating layer by thermally curing the laminated resin film (hereinafter, referred to as an insulating layer forming step (2)).

(3) a step of drilling a hole through the circuit board on which the interlayer insulating layer is formed (hereinafter, referred to as a drilling step (3)).

(4) a step of roughening the surface of the interlayer insulating layer by an oxidant (hereinafter, referred to as a roughening step (4)).

(5) a step of forming a conductor layer through plating, on the roughened surface of the interlayer insulating layer (hereinafter, referred to as a conductor layer forming step (5)).

(6) a step of forming a circuit on the conductor layer (hereinafter, referred to as a circuit forming step (6)).

The laminating step (1) is a step of laminating the support-attached resin film of the present embodiment on one surface or both surfaces of the circuit board by using a vacuum laminator. As for the vacuum laminator, a vacuum laminator as a commercially available product may be used.

When a protective film is formed on the support-attached resin film, after the protective film is removed, lamination may be carried out by pressurization and heating through press-bonding to the circuit board so that the resin composition layer comes in contact with the circuit board.

The lamination may be carried out under conditions including a press-bonding temperature (lamination temperature) of 60 to 140° C., and a press-bonding pressure of 0.1 to 1.1 MPa ($9.8 \times 10^4$ to $107.9 \times 10^4$ N/m$^2$), under reduced pressure of air pressure 20 mmHg (26.7 hPa) or less, as necessary, after the support-attached resin film and the circuit board are previously heated (pre-heated). Further, the lamination method may be a batch-type, or may be a continuous-type with a roll.

In the insulating layer forming step (2), the support-attached resin film laminated on the circuit board is heated while the support is attached, and the resin composition layer is cured to form the interlayer insulating layer.

The condition for heat-curing is selected, for example, in a range from 150 to 220° C. and from 20 to 120 min, and preferably selected in a range from 160 to 200° C. and from 30 to 120 min. Also, heat-curing may be divided into two stages. After heating is performed at 150° C. or less for 5 to 30 min, heating may be performed at 160 to 200° C. in a range from 20 to 120 min so that curing may be performed.

In the drilling step (3), drilling is carried out on the circuit board and the formed interlayer insulating layer by a method of drilling, laser, plasma, or a combination thereof so as to form via holes, through holes, and the like. Example of the laser may include $CO_2$ gas laser, YAG laser, UV laser, excimer laser, and the like.

Further, the support may be peeled off before the step (3), or may be peeled off after the step (3). When the support is peeled off after the drilling step (3), the smoothness of the interlayer insulating layer around the via holes tends to be good.

In the roughening step (4), the surface of the interlayer insulating layer is roughened by an oxidant. Also, when via holes, through holes, etc. are formed through the interlayer insulating layer and the circuit board, so-called "smear" occurring when these are formed may be removed by the oxidant. The roughening treatment and the smear removal may be simultaneously performed.

Examples of the oxidant may include permanganate (potassium permanganate, sodium permanganate, etc.), dichromate, ozone, hydrogen peroxide, sulfuric acid, nitric acid, and the like. Among these, it is preferable to use an alkaline permanganate solution (for example, a sodium hydroxide aqueous solution of potassium permanganate, or sodium permanganate) which is an oxidant commonly used for roughening the interlayer insulating layer in manufacturing the multilayer printed wiring board according to a build-up construction method.

Through the roughening treatment, uneven anchors are formed on the surface of the interlayer insulating layer. Further, the arithmetic mean roughness Ra of the roughened interlayer insulating layer is preferably 300 nm or less, more preferably 100 to 250 nm, further preferably 150 to 230 nm from the viewpoint of obtaining an excellent adhesive strength with the conductor layer and the viewpoint of a fine wiring property.

In the conductor layer forming step (5), the conductor layer is formed through plating on the roughened surface of the interlayer insulating layer on which the uneven anchors are formed.

Examples of the plating method may include an electroless plating method, an electrolytic plating method, and the like. A metal for plating is not particularly limited as long as it is a metal that can be used for plating.

Further, it is possible to employ a method in which first, a plating resist having a pattern opposite to that of the conductor layer (wiring pattern) is formed, and then, the conductor layer (wiring pattern) is formed only by electroless plating.

After the conductor layer is formed, an annealing treatment may be carried out at 150 to 200° C. for 20 to 90 min. When the annealing treatment is carried out, the adhesive strength between the interlayer insulating layer and the conductor layer tends to be further improved and stabilized.

In the circuit forming step (6), as for the method of forming the circuit through pattern-processing of the conductor layer, a conventionally known method such as a subtractive method or a semiadditive method (SAP: Semi-Additive Process) may be used.

The surface of the conductor layer produced in this manner may be roughened. When the surface of the conductor layer is roughened, the adhesiveness to a resin in contact with the conductor layer tends to be improved. In roughening the conductor layer, "CZ-8100," "CZ-8101," "CZ-5480" (all are manufactured by MEC Co., Ltd., product names), etc. which are organic acid-based microetching agents may be used.

The circuit board used for the multilayer printed wiring board of the present embodiment is not particularly limited, but examples thereof may include those in which a pattern-processed conductor layer (circuit) is formed on one surface or both surfaces of a substrate such as glass epoxy, a metal substrate, a polyester substrate, a polyimide substrate, a BT resin substrate, or a thermally curable polyphenylene ether substrate.

The circuit board in the present embodiment also includes: a multilayer printed wiring board in which a conductor layer and an interlayer insulating layer are alternately formed as layers, and a pattern-processed conductor layer (circuit) is provided on one surface or both surfaces; the above circuit board that has, on one surface or both surfaces thereof, an interlayer insulating layer formed from the support-attached resin film of the present embodiment, in which a pattern-processed conductor layer (circuit) is provided on one surface or both surfaces; and a cured product formed by laminating and curing the support-attached resin film of the present embodiment (the layer structure has an adhesive auxiliary layer, a resin composition layer for an interlayer insulating layer, a resin composition layer for an interlayer insulating layer, and an adhesive auxiliary layer in this order), which has a pattern-processed conductor layer (circuit) on one surface or both surfaces.

From the viewpoint of adhesion of the interlayer insulating layer to the circuit board, the surface of the conductor layer of the circuit board may be previously roughened by blackening or the like.

EXAMPLES

Hereinafter, the present invention will be specifically described by Examples, but the present invention is not limited by these Examples. Also, the average maximum height of exposed portions of exposed particles on the surface of the support was measured by the following method.

[Measurement of Average Maximum Height of Exposed Portions of Exposed Particles]

Maximum heights were obtained at any three places in accordance with JIS B0601-1994 by using a non-contact type surface roughness measurement device "Contour GT-X" (manufactured by Bruker), and then, an average value thereof was set as the average maximum height of exposed portions of exposed particles on the surface of the support.

[Production of Support-Attached Resin Film for Interlayer Insulating Layer]

(1) Preparation of Support

As for a support, supports A1 to A3 noted in Table 1 were used.

TABLE 1

| Type of support | A1 | A2 | A3 |
|---|---|---|---|
| Material | PET | PET | PET |
| Thickness (μm) | 38 | 16 | 38 |
| Type of release agent | Silicon-based | Silicon-based | Silicon-based |
| Average maximum height of exposed portions of exposed particles (μm) | 0.6 | 0.5 | 3.7 |

(2) Preparation of Resin Varnish (Resin Composition (1)) for Interlayer Insulating Layer Production Example 1

Components noted in Table 2 were blended with toluene until the solid content concentration became 70% by mass, and then were stirred until a resin component was dissolved. Next, dispersing was performed through bead-mill treatment to obtain a resin varnish B1 for an interlayer insulating layer.

TABLE 2

| Resin varnish for interlayer insulating layer | | Production Example 1 B1 |
|---|---|---|
| Component (a) | N673 | 13.6 |
| Component (b) | BA230S75 | 4.4 |
| Component (c) | HPC-8000-65T | 7.2 |
| Component (d) | curing accelerator 1 | 0.07 |
| Component (e) | vinylsilane-treated silica | 73.3 |
| Component (f) | dicyandiamide | 0.03 |
| Component (g) | YX1256B40 | 1.3 |
| Component (h) | BYK330 | 0.03 |

Details of each component noted in Table 2 will be described below.

[Component (a)]

N673: cresol novolac type epoxy resin (manufactured by DIC Corporation, a product name, epoxy equivalent: 210 g/eq, solid content concentration: 100% by mass)

[Component (b)]

BA230S75: prepolymer of bisphenol A dicyanate (manufactured by Lonza, a product name, solid content concentration: 75% by mass, MEK cut product)

[Component (c)]

HPC-8000-65T: active ester curing agent (manufactured by DIC Corporation, a product name, an active ester compound including a dicyclopentadiene type diphenol structure, active ester equivalent: 223 g/eq, solid content concentration 65% by mass, toluene cut product)

[Component (d)]

curing accelerator 1: addition reaction product between tributylphosphine and 1,4-benzoquinone, which is represented by the following formula (d-4) (solid content concentration: 100% by mass)

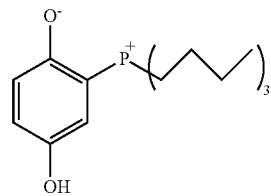

(d-4)

[Component (e)]

vinylsilane-treated silica: spherical silica treated with a vinylsilane coupling agent (volume average particle size: 0.5 μm, solid content concentration: 100% by mass)

[Component (f)]

dicyandiamide: (solid content concentration: 100% by mass)

[Component (g)]

YX1256B40: a phenoxy resin having a bisphenol A skeleton (manufactured by Mitsubishi Chemical Corporation, a product name, solid content concentration: 40% by mass, MEK cut product)

[Component (h)]

BYK330: a resin having a siloxane skeleton (manufactured by BYK Chemi Japan Co., Ltd., a product name, solid content concentration: 25% by mass, xylene cut product)

(3) Preparation of Resin Varnish (Resin Composition (2)) for Adhesive Auxiliary Layer Production Examples 2 to 5

Components noted in Table 3 were blended with dimethylacetamide until the solid content concentration became 20% by mass, and then stirred until a resin component was dissolved. Dispersing was performed through bead-mill treatment to obtain resin varnishes C1 to C4 for an adhesive auxiliary layer.

TABLE 3

| Resin varnish for adhesive auxiliary layer | | Production Example 2 C1 | Production Example 3 C2 | Production Example 4 C3 | Production Example 5 C4 |
|---|---|---|---|---|---|
| Component (i) | NC-3000-H | 38.0 | 39.7 | 36.4 | 33.1 |
| Component (j) | BA230S75 | 38.2 | 39.8 | 36.5 | 33.2 |
| Component (k) | AEROSIL R972 | 8.0 | 4.0 | 12.0 | 20.0 |
| Component (m) | BPAM-155 | 6.5 | 6.7 | 6.2 | 5.6 |
| Component (n) | YX1256B40 | 9.2 | 9.6 | 8.8 | 8.0 |
| Component (o) | Curing accelerator 1 | 0.12 | 0.13 | 0.12 | 0.11 |

Details of each component noted in Table 3 will be described below.

[Component (i)]

NC-3000-H: A novolac type epoxy resin containing a biphenylaralkyl structure (manufactured by Nippon Kayaku Co., Ltd., a product name, solid content concentration: 100% by mass, epoxy equivalent: 289 g/eq)

[Component (j)]

BA230S75: prepolymer of bisphenol A dicyanate (manufactured by Lonza, product name, solid content concentration 75% by mass, MEK cut product)

[Component 00]
AEROSIL R972: fumed silica (manufactured by Nippon AEROSIL Co., Ltd., a product name, solid content concentration: 100% by mass, specific surface area: 100 m²/g)

[Component (m)]
BPAM-155: a rubber modified polyamide resin having an amino group at the terminal (manufactured by Nippon Kayaku Co., Ltd., a product name, solid content concentration: 100% by mass, number average molecular weight: 26,000, weight average molecular weight: 110,000)

[Component (n)]
YX1256B40: a phenoxy resin having a bisphenol A skeleton (manufactured by Mitsubishi Chemical Corporation, a product name, solid content concentration: 40% by mass, MEK cut product)

[Component (o)]
curing accelerator 1: addition reaction product between tributylphosphine and 1,4-benzoquinone, which is represented by the above formula (d-4) (solid content concentration: 100% by mass)

(4) Production of Support-Attached Resin Film for Interlayer Insulating Layer

Example 1

The above obtained resin varnish C1 for the adhesive auxiliary layer was applied to one side surface of the support A1 by using a die coater, and dried at 130° C. for 2 min, to form the adhesive auxiliary layer with a thickness of 4 μm on the support. Next, the resin varnish B1 for the interlayer insulating layer was applied to the surface of the formed adhesive auxiliary layer by using the die coater, and dried at 100° C. for 1.5 min to form a resin composition layer for the interlayer insulating layer with a thickness of 36 μm. Accordingly, a support-attached resin film for the interlayer insulating layer, which has the support, the adhesive auxiliary layer, and the resin composition layer for the interlayer insulating layer in this order, was obtained.

Examples 2 to 5, Comparative Examples 1 and 2

A support-attached resin film for an interlayer insulating layer was obtained in the same manner as in Example 1 except that the types of a resin varnish for an adhesive auxiliary layer and a support were changed into those noted in Table 4.

[Evaluation of Support-Attached Resin Film for Interlayer Insulating Layer]

Next, the following various evaluations were performed on the support-attached resin film for the interlayer insulating layer (hereinafter, also simply referred to as a "resin film") obtained in each Example. The evaluation results are noted in Table 4.

(Presence/Absence of Coarse Recesses on Resin Surface)

The resin film obtained in each Example was cut into a 200 mm square, and then disposed such that the resin composition layer for the interlayer insulating layer faced the circuit surface of a printed wiring board. Then, lamination was performed.

Further, as for the printed wiring board, a copper-clad laminate "MCL-E-679 FG" (manufactured by Hitachi Chemical Co., Ltd., a product name) having a copper layer with a thickness of 35 μm, which had been subjected to an arbitrary circuit processing by a subtractive method with a copper residual ratio of 0 to 95%, was used. Also, the lamination was performed by using a vacuum pressure-type laminator "MVLP-500/600 IIA" (manufactured by Meiki Co., Ltd., a product name) as a device, in which evacuation was performed at 110° C. for 30 sec, and pressurization was performed at 0.5 MPa for 30 sec. Then, hot pressing was performed at 110° C. for 60 sec, at 0.5 MPa.

Next, after cooling to room temperature, while the support is attached, curing was performed at 130° C. for 20 min, and then at 180° C. for 40 min, in an explosion-proof dryer. Then, the support was peeled off, and an evaluation substrate was produced.

Next, the obtained evaluation substrate was subjected to a desmear treatment. In the desmear treatment, the evaluation substrate was immersed in a swelling solution "Swelling Dip Securiganth P" heated to 70° C. for 10 min, immersed in a roughening solution "Concentrate Compact CP" heated to 80° C. for 10 min, and then immersed in a neutralization solution "Reduction Securiganth P500" heated to 40° C. for 5 min so that neutralization was performed (all processing liquids were manufactured by Atotech Japan Co., Ltd.).

The resin surface of the evaluation substrate which had been subjected to the desmear treatment was observed at a magnification of 1,000 in an inspection range of a 10 mm square by using a scanning electron microscope (manufactured by Hitachi High-Tech Corporation, SU-3500), and the presence/absence of coarse recesses was checked. Further, a resin surface not having a recess with a diameter of 2 μm or more was defined as "none" of coarse recesses and one having a recess of 2 μm or more was defined as "presence" of coarse recesses. Also, FIG. 2 illustrates a surface SEM photograph of the interlayer insulating layer obtained in Example 1.

(Arithmetic Mean Roughness (Ra))

On the above obtained resin surface of the evaluation substrate which had been subjected to the desmear treatment, at any three places, an arithmetic mean roughness (Ra) was measured by using a non-contact type surface roughness meter (manufactured by Bruker, a product name: Contour GT-X), and an average value thereof was obtained.

(Dielectric Loss Tangent)

The resin film obtained in each Example was heated at 190° C. for 90 min and thermally cured, and then, the support was peeled off to obtain a cured product. A test piece (a length 80 mm and a width 2 mm) was obtained by cutting the cured product, and a dielectric loss tangent was measured by using "HP8362B" manufactured by Agilent Technologies Inc. through a cavity resonance perturbation method at a measurement frequency of 5.8 GHz at a measurement temperature of 23° C.

(Reflow Heat Resistance)

The reflow heat resistance was evaluated by the following procedures (1) to (5).

(1) Production of Circuit Board

Circuit patterns were formed through etching on both surfaces of a double-sided copper-clad laminate (manufactured by Hitachi Chemical Co., Ltd., a product name: MCL-E-700 G(R), copper foil thickness: 12 μm, base material thickness: 0.4 mm) of an epoxy resin having a glass-cloth base material, and a roughening treatment was further performed by using "MECetchBond C (registered trademark) CZ8101" manufactured by MEC Co., Ltd. Also, an anti-corrosion treatment was performed by using "MECetchBond (registered trademark) CL-8301" manufactured by MEC Co., Ltd. Accordingly, a circuit board was produced. Further, a circuit pattern with a copper residual ratio of 80 to 100% was used.

(2) Lamination Method of Resin Film

The resin film produced in each Example was disposed such that the resin composition layer for the interlayer insulating layer was placed on the circuit surface side of the circuit board, and was laminated on both surfaces of the circuit board produced in (1) by using a batch-type vacuum pressurize laminator "MVLP-500" (manufactured by Meiki Co., Ltd., a product name). The lamination was carried out by setting the atmospheric pressure to 15 hPa or less under reduced pressure for 30 sec, and performing press-bonding at 100° C. for 30 sec, at a pressure of 0.5 MPa.

(3) Formation of Interlayer Insulating Layer

The test sample obtained in (2) was cooled to room temperature, and then heated at 130° C. for 20 min, and then at 180° C. for 40 min while the support (PET film) was attached. Then, the resin composition layer for the interlayer insulating layer was cured to form the interlayer insulating layer. Next, the support was peeled off from the formed interlayer insulating layer.

(4) Desmear Treatment Method

The test sample obtained in (3) was subjected to a desmear treatment by the same method as that for the evaluation substrate produced in the above presence/absence evaluation of the coarse recesses.

(5) Electroless Plating and Electroplating

An electroless-plated layer from 200 to 250 nm was formed by performing immersion in "Cleaner Securiganth 902" as a cleaner at 60° C. for 5 min, and then immersion in "Pre Dip Neoganth B" as a predip solution at 25° C. for 2 min, in "activator Neoganth 834" as a seeder at 40° C. for 5 min, in "reducer Neoganth WA" as a reducing solution at 30° C. for 5 min, and in "MSK-DK" as electroless plating at 30° C. for 30 min (all processing liquids were manufactured by Atotech Japan Co., Ltd.). Also, in a copper sulfate plating bath, at a current density of 2 A/dm$^2$, an electroplated layer with a plating thickness of 25 to 30 μm was formed. The obtained electroplated substrate was cut into 40 mm squares, and 10 evaluation substrates were produced for each.

As for a reflow device, an air reflow system manufactured by TAMURA Corporation (product number: TAR-30-366 PN) was used, and the inside of the reflow device was set to a maximum of 260° C. in use. The above obtained evaluation substrate was passed through the reflow device, and the number of passes until swelling occurred was examined. An average value of 10 test samples was taken as the average number of passes of reflow.

From Table 4, it is found that the interlayer insulating layer formed by the resin film obtained in Examples 1 to 5 had no coarse recesses appearing on the resin surface, a good roughened shape, and also a small dielectric loss tangent, and then the heat resistance was also sufficient. Also, from the surface SEM photograph of the interlayer insulating layer formed in Example 1, as illustrated in FIG. 2, it is found that no coarse recesses are occurring.

Meanwhile, in the interlayer insulating layer formed by the resin film obtained in Comparative Examples 1 and 2, coarse recesses occurred on the resin surface.

INDUSTRIAL APPLICABILITY

Even when the support-attached resin film for the interlayer insulating layer of the present invention is cured while the support is attached, the occurrence of coarse recesses on the surface of the formed interlayer insulating layer is suppressed. Thus, the dielectric loss tangent is small, and the heat resistance is excellent. Accordingly, the support-attached resin film for the interlayer insulating layer of the present invention and a multilayer printed wiring board using the support-attached resin film for the interlayer insulating layer can be widely used for electrical products such as computers, mobile phones, digital cameras, and televisions, and vehicles such as motorcycles, automobiles, trains, ship, and aircraft.

REFERENCE SIGNS LIST 1 coarse recess
2 surface of interlayer insulating layer

The invention claimed is:

1. A support-attached resin film for an interlayer insulating layer, comprising: the support, and a resin composition layer formed on one side surface of the support,
    wherein the support has particles exposed on the one side surface, and an average maximum height of exposed portions of the particles is 1.0 μm or less.

2. The support-attached resin film for an interlayer insulating layer according to claim 1, wherein the support is a polyethylene terephthalate film, and a thickness thereof is 75 μm or less.

3. The support-attached resin film for an interlayer insulating layer according to claim 1, wherein the resin compo-

TABLE 4

|  |  | Example | | | | | Comparative Example | |
|---|---|---|---|---|---|---|---|---|
|  |  | 1 | 2 | 3 | 4 | 5 | 1 | 2 |
| Configuration of resin film | Type of support | A1 | A1 | A1 | A1 | A2 | A3 | A3 |
|  | Type of resin varnish for interlayer insulating layer | B1 | B1 | B1 | B1 | B1 | B1 | B1 |
|  | Type of resin varnish for adhesive auxiliary layer | C1 | C2 | C3 | C4 | C1 | C1 | C4 |
| Evaluation result | Presence/absence of coarse recess | Absence | Absence | Absence | Absence | Absence | Presence | Presence |
|  | Arithmetic mean roughness Ra(nm) | 210 | 184 | 254 | 312 | 206 | 204 | 328 |
|  | Dielectric loss tangent (—) | 0.0078 | 0.0074 | 0.0078 | 0.0079 | 0.0078 | 0.0077 | 0.0078 |
|  | Average number of passes of reflow (times) | 16 | 18 | 15 | 15 | 16 | 16 | 16 | sition layer is a layer containing a resin composition (1) containing an epoxy resin (a) and a cyanate resin (b).

4. The support-attached resin film for an interlayer insulating layer according to claim 3, wherein the resin composition (1) further contains at least one selected from an active ester curing agent (c), a curing accelerator (d), and inorganic filler (e).

5. The support-attached resin film for an interlayer insulating layer according to claim 4, wherein the resin composition (1) contains the epoxy resin (a), the cyanate resin (b), the active ester curing agent (c), the curing accelerator, (d) and the inorganic filler (e), and
   a content of the epoxy resin (a) is from 5 to 40 parts by mass, a content of the cyanate resin (b) is from 1 to 20 parts by mass, a content of the active ester curing agent (c) is from 2 to 30 parts by mass, a content of the curing accelerator (d) is from 0.01 to 1 part by mass, and a content of the inorganic filler (e) is from 40 to 85 parts by mass with respect to 100 parts by mass of the resin composition (1) in terms of solid content.

6. The support-attached resin film for an interlayer insulating layer according to claim 3, wherein the resin composition (1) further contains at least one selected from dicyandiamide (f), a phenoxy resin (g), and a resin having a siloxane skeleton (h).

7. The support-attached resin film for an interlayer insulating layer according to claim 3, wherein the resin composition layer includes a resin composition layer for the interlayer insulating layer and an adhesive auxiliary layer, and the resin composition layer for the interlayer insulating layer is a layer obtained by forming the resin composition (1) as a layer.

8. The support-attached resin film for an interlayer insulating layer according to claim 7, wherein the adhesive auxiliary layer is a layer obtained by forming a resin composition (2) containing an epoxy resin (i) and a cyanate resin (j) as a layer.

9. The support-attached resin film for an interlayer insulating layer according to claim 8, wherein the resin composition (2) further contains at least one selected from an inorganic filler having a specific surface area of 20 m$^2$/g or more (k), a polyamide resin containing a polybutadiene skeleton (m), and a phenoxy resin (n).

10. The support-attached resin film for an interlayer insulating layer according to claim 7, wherein a thickness of the support is from 10 to 150 μm, a thickness of the resin composition layer for the interlayer insulating layer is from 5 to 50 μm, and a thickness of the adhesive auxiliary layer is from 1 to 10 μm.

11. The support-attached resin film for an interlayer insulating layer according to claim 1, which is used when the resin composition layer is cured to form the interlayer insulating layer while the support is not peeled off.

12. A multilayer printed wiring board comprising an interlayer insulating layer formed by using the support-attached resin film for an interlayer insulating layer according to claim 1.

13. The multilayer printed wiring board according to claim 12, wherein an arithmetic mean roughness Ra of the interlayer insulating layer is 300 nm or less.

14. A method of manufacturing a multilayer printed-wiring board, the method comprising forming an interlayer insulating layer by using the support-attached resin film for an interlayer insulating layer according to claim 1.

15. The method of manufacturing the multilayer printed wiring board according to claim 14, wherein the step of forming of the interlayer insulating layer is a step of heating the support-attached resin film for an interlayer insulating layer in a state where the support is not peeled off, so as to thermally cure the resin composition layer.

16. The support-attached resin film for an interlayer insulating layer according to claim 1, wherein the resin composition layer does not contain a fiber base material.

17. The support-attached resin film for an interlayer insulating layer according to claim 1, wherein the average maximum height of exposed portions of the particles is 0.8 μm or less.

18. The support-attached resin film for an interlayer insulating layer according to claim 1, wherein the average maximum height of exposed portions of the particles is 0.5 μm or less.

19. The support-attached resin film for an interlayer insulating layer according to claim 1, wherein the average maximum height of exposed portions of the particles is 0.3 μm or less.

20. The support-attached resin film for an interlayer insulating layer according to claim 1, the particles exposed on the one side surface comprise particles used as a lubricant during production of the support.

* * * * *